(12) United States Patent
Lee et al.

(10) Patent No.: US 7,449,741 B2
(45) Date of Patent: Nov. 11, 2008

(54) SRAM CELL STRUCTURE AND MANUFACTURING METHOD THEREOF

(75) Inventors: Tzung-Han Lee, Taipei (TW); Kuang-Pi Lee, Fongyuan (TW); Wen-Jeng Lin, Pan-Chiao (TW); Rern-Hurng Larn, Taipei (TW)

(73) Assignee: United Microeletronic Corp., Hsinchu (TW)

( * ) Notice: Subject to any disclaimer, the term of this patent is extended or adjusted under 35 U.S.C. 154(b) by 242 days.

(21) Appl. No.: 11/416,699

(22) Filed: May 2, 2006

(65) Prior Publication Data

US 2006/0202247 A1    Sep. 14, 2006

Related U.S. Application Data

(62) Division of application No. 10/983,140, filed on Nov. 4, 2004, now Pat. No. 7,157,763.

(30) Foreign Application Priority Data

Nov. 11, 2003   (TW)   .............................. 92131476 A

(51) Int. Cl.
*H01L 27/108* (2006.01)

(52) U.S. Cl. ........................ 257/303; 257/300; 257/301; 257/E21.661; 257/E27.098; 438/243

(58) Field of Classification Search ................. 257/303, 257/E21.661

See application file for complete search history.

(56) References Cited

U.S. PATENT DOCUMENTS

| 2001/0028075 A1* | 10/2001 | Chen et al. .................... 257/296 |
| 2004/0121533 A1* | 6/2004 | Huang et al. ................. 438/249 |
| 2005/0056885 A1* | 3/2005 | Pai et al. ...................... 257/330 |

* cited by examiner

*Primary Examiner*—Tu-Tu V Ho
(74) *Attorney, Agent, or Firm*—J.C. Patents

(57) ABSTRACT

A static random access memory (SRAM) cell structure at least comprising a substrate, a transistor, an upper electrode and a capacitor dielectric layer. A device isolation structure is set up in the substrate to define an active region. The active region has an opening. The transistor is set up over the active region of the substrate. The source region of the transistor is next to the opening. The upper electrode is set up over the opening such that the opening is completely filled. The capacitor dielectric layer is set up between the upper electrode and the substrate.

3 Claims, 12 Drawing Sheets

SRAM CELL STRUCTURE AND MANUFACTURING METHOD THEREOF

CROSS-REFERENCE TO RELATED APPLICATION

This application is a divisional application of, and claims the priority benefit of, U.S. application Ser. No. 10/983,140 filed on Nov. 04, 2004 now U.S. Pat. No. 7,157,763, which claims the priority benefit of Taiwan application serial no. 92131476, filed on Nov. 11, 2003.

BACKGROUND OF THE INVENTION

1. Field of the Invention

The present invention relates to a memory device. More particularly, the present invention relates to a static random access memory (SRAM) cell structure and manufacturing method thereof.

2. Description of the Related Art

As semiconductors having deep sub-micron features are fabricated, overall dimension of integrated circuit devices shrinks correspondingly. In the case of memory devices, overall dimension of each memory cell is also reduced. With the development of high tech electronic products (for example, computers, mobile phones, digital cameras or personal digital assistants), the amount of data that needs to be stored and process increases considerably. To meet the memory capacity demanded by these information technology products, smaller and higher quality integrated memory devices has to be developed.

Random access memory (RAM) is a type of volatile memory which has many applications in information technology products. In general, random access memory can be classified into static random access memory (SRAM) and dynamic random access memory (DRAM).

In each SRAM cell, digital data is stored as the conductive state of a transistor. Hence, a conventional SRAM cell consists of either a set of four transistors and two resistors (4T2R configuration) or a set of six transistors (6T configuration). On the other hand, digital data is stored as the charging state of a capacitor inside each DRAM cell. Accordingly, a conventional DRAM cell consists of a transistor and a capacitor (including a stacked capacitor or a deep trench capacitor.

In general, SRAM has a faster data processing speed and is possible to integrated with a complementary metal-oxide-semiconductor (CMOS) fabrication process. In other words, the process for manufacturing SRAM is simpler. However, one major drawback of incorporating SRAM is that area occupied by each cell is considerably larger (a SRAM cell with six transistors occupy an area roughly 10 to 16 times that of a DRAM cell). Yet, despite the considerable saving of area in incorporating DRAM cells, this advantage is counteracted by the complicated processes and hence the cost needed to manufacture the capacitor within each DRAM cell.

In recent years, a one transistor SRAM cell (1T-SRAM) (also referred to as a pseudo-SRAM) has been developed. The 1T-SRAM uses a DRAM memory cell (1T1C configuration) to replace the SRAM cell (6T or 4T2R configuration) but is able to maintain the peripheral circuit structure of the original SRAM. Therefore, memory cell dimension is reduced and the level of integration is increased, and yet the refresh-free property and small random access cycle time of a SRAM cell can be retained. In other words, the 1T-SRAM is a potential candidate for replacing the conventional SRAM and DRAM cells.

At present, most manufacturers use the DRAM manufacturing process (for example, in U.S. Pat. No. 6,468,855 and U.S. Pat. No. 6,573,548) to manufacture the 1T-SRAM. Since the DRAM manufacturing process involve complicated steps, production cost is relatively high.

SUMMARY OF THE INVENTION

Accordingly, one object of the present invention is to provide a static random access memory (SRAM) cell structure and manufacturing method thereof having a simpler processing step and yet capable of increasing the integration level of devices and reducing the overall production cost.

To achieve these and other advantages and in accordance with the purpose of the invention, as embodied and broadly described herein, the invention provides a static random access memory (SRAM) cell structure. The SRAM cell has a device isolation structure to define an active region in a substrate. The active region has a first opening. A transistor is set up on the active region of the substrate. Furthermore, the source region of the transistor is next to the first opening. An upper electrode is set up over the first opening. The upper electrode completely fills the first opening but the upper electrode is isolated from the substrate by a capacitor dielectric layer.

In the aforementioned SRAM cell structure, the device isolation structure may further include a second opening. The second opening exposes a portion of the substrate on the sidewall of the device isolation structure. Furthermore, the upper electrode is set up over the second opening so that the second opening is completely filled.

In the aforementioned structure, because the first opening is set up in the active region and the upper electrode is set up within the opening, the overlapping region between the upper electrode and a lower electrode is increased. Hence, overall capacitance of the storage capacitor is increased. In addition, if the second opening that exposes a portion of the substrate on the sidewall of the device isolation structure is formed, capacitance of the storage capacitor is further increased. Ultimately, the dimension of each device can be further reduced.

This invention also provides a static random access memory (SRAM) cell structure. The SRAM cell has a device isolation structure to define an active region in a substrate. The active region has an opening located within the device isolation structure. A lower electrode is set up within the opening. An upper electrode is set up over the opening such that the upper electrode completely fills the opening. A capacitor dielectric layer isolates the upper electrode from the lower electrode. A transistor is set up on the active region of the substrate. The source terminal of the transistor is electrically connected to the lower electrode.

In the aforementioned structure, the opening is set up in the substrate such that a portion of the opening is located within the active region and another portion of the opening is located within the device isolation structure. Moreover, the upper electrode is set up within the opening so that the overlapping region between the upper electrode and the lower electrode is increased. Hence, compared with a capacitor having a planar design, the capacitance of the capacitor will increase 3 to 4 folds. Furthermore, with a portion of the upper electrodes set up within the device isolation structure, overall dimension of each device can be reduced.

This invention also provides a static random access memory (SRAM) cell structure. The SRAM cell has a device isolation structure to define a first active region and a second active region in a substrate. The device isolation structure between the first active region and the second active region has an opening that exposes a portion of the substrate on the sidewall of the device isolation structure. A first transistor is set up over the first active region of the substrate and a second transistor is set up over the second active region of the substrate. The source region of the first transistor and the second transistor are linked to the opening. An upper electrode is set up over the opening. The upper electrode completely fills the opening. The upper electrode is isolated from the substrate through a capacitor dielectric layer.

In the aforementioned SRAM cell structures, a doped isolation region is set up in the substrate at the bottom of the device isolation structure to strengthen device isolation. Furthermore, because the opening is set up within the device isolation structure and the upper electrode is set up within the opening, overlapping region between the upper electrode and the lower electrode is increased. Hence, compared with a conventional capacitor having a planar structure, the capacitance of the capacitor will increase 2 to 4 folds. In addition, with the upper electrode set up within the device isolation structure, overall dimension of each device can be reduced.

This invention also provides a method of fabricating static random access memory (SRAM) cells. First, a device isolation structure is formed in a substrate to define an active region. A first opening is formed within the active region of the substrate. A dielectric layer is formed over the substrate so that a capacitor dielectric layer is also formed over the interior surface of the first opening. Thereafter, a gate is formed over the substrate and then an upper electrode is formed over the first opening such that the upper electrode completely fills the first opening. Finally, source/drain regions are formed in the substrate using the gate and the upper electrode as a mask.

In the aforementioned method, the step of forming the first opening in the substrate further comprises forming a second opening that exposes a portion of the substrate on the sidewall of the device isolation structure. Furthermore, in the step of forming the dielectric layer over the substrate and the capacitor dielectric layer on the interior surface of the first opening, a capacitor dielectric layer is also formed on the interior surface of the second opening. In addition, in the step of forming the gate over the substrate and the upper electrode over the first opening, the upper electrode also completely fills the second opening.

In the step of forming the first opening in the substrate, a portion of the first opening may lie within the device isolation structure. Furthermore, after forming the first opening in the substrate but before forming the dielectric layer over the substrate and the capacitor dielectric layer over the first opening, a lower electrode may also be formed inside the first opening.

In the aforementioned method, the first opening is formed over the active region and the upper electrode is formed over the first opening with the upper electrode completely filling the first opening. Thus, the overlapping region between the upper electrode and the lower electrode is increased. Ultimately, the capacitance of the storage capacitor in the SRAM cell is increased.

If the second opening is formed within the device isolation structure such that the capacitor dielectric layer and the upper electrode is also formed within the second opening, the capacitance of the storage capacitor is further increased. Since the first opening and the second opening are formed in the same step, no additional processes are incurred.

In addition, if a portion of the first opening is located within the device isolation structure, not only is the capacitance of the storage capacitor increased but the dimension of each SRAM cell is also reduced as well.

Furthermore, the gate of the transistor and the upper electrode of the capacitor are formed in the same step. Hence, the amount of processing and the cost of producing the SRAM cell are reduced.

This invention also provides a second method of fabricating static random access memory (SRAM) cells. First, a device isolation structure is formed in a substrate so that a first active region and a second active region are patterned out. An opening is formed within the device isolation structure between the first active region and the second active region. The opening exposes a portion of the substrate on the sidewall of the device isolation structure. A dielectric layer is formed over the substrate so that a capacitor dielectric layer is also formed over the interior surface of the opening. Thereafter, a first gate and a second gate are formed over the substrate and then an upper electrode is formed over the opening such that the upper electrode completely fills the opening. Finally, source/drain regions are formed in the substrate using the first gate, the second gate and the upper electrode as a mask.

In the aforementioned method, after the step of forming the first opening in the device isolation structure between the first active region and the second active region but before forming the dielectric layer over the substrate and the capacitor dielectric layer over the opening, a doped isolation region may also be formed in the exposed area at the bottom of the device isolation structure. Furthermore, in the step of forming the opening within the device isolation structure between the first active region and the second active region, a portion of the opening may lie inside the first active region and the second active region.

In the aforementioned method, the opening is formed within the device isolation structure and the upper electrode is formed within the opening so that the overlapping area between the upper electrode and the lower electrode is increased. Hence, the capacitance of the storage capacitor can be increased 2 to 4 times over that of a capacitor having a planar structure. Furthermore, with the upper electrode formed inside the device isolation structure and the capacitor linking up both the first transistor and the second transistor connected to the same upper electrode, device dimension can be further reduced.

Furthermore, the first transistor, the second transistor and the upper electrode of the capacitor are formed in the same step. Hence, the amount of processing and the cost of producing the SRAM cell are reduced.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1A:
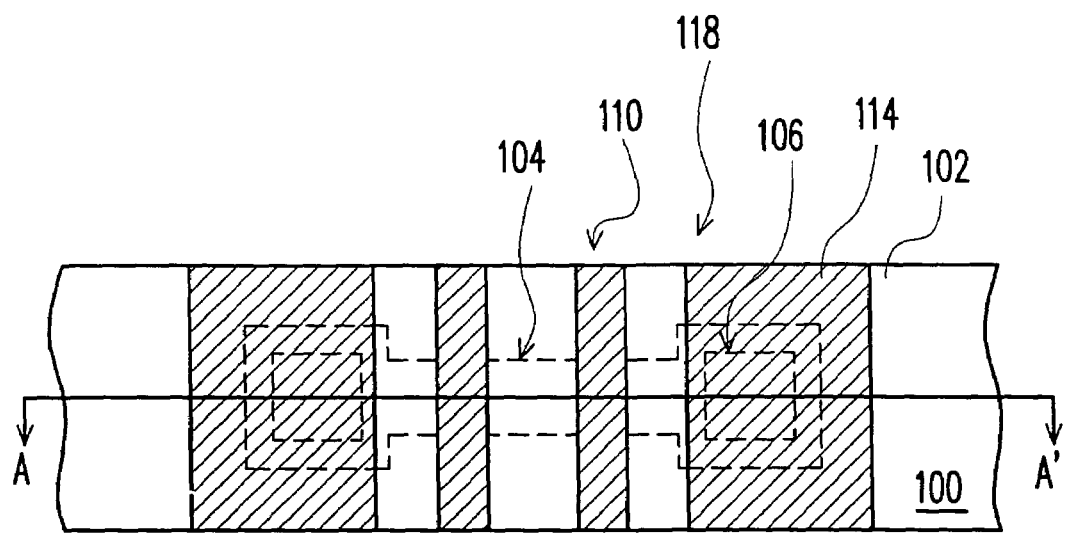
FIGS. 1A and 1B are the respective top view and cross-sectional view of a static random access memory cell structure according to a first preferred embodiment of this invention.

Reference will now be made in detail to the present preferred embodiments of the invention, examples of which are illustrated in the accompanying drawings. Wherever possible, the same reference numbers are used in the drawings and the description to refer to the same or like parts.

Figure 1B:
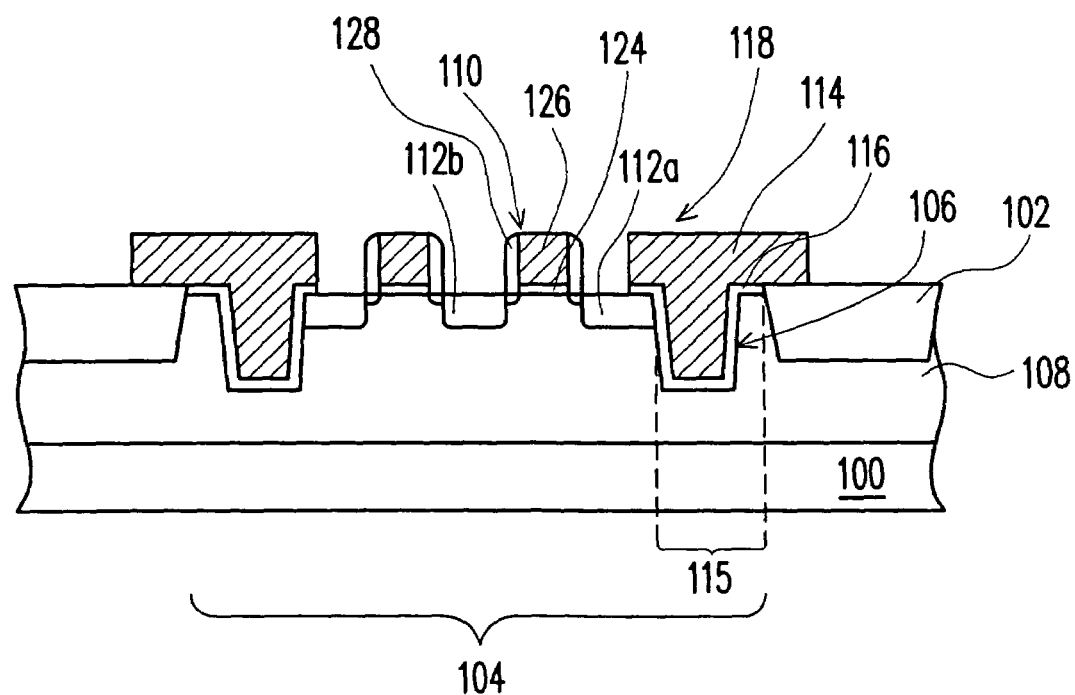

FIGS. 1A and 1B are the respective top view and cross-sectional view of a static random access memory cell structure according to a first preferred embodiment of this invention. FIG. 1B is a cross-sectional view along line A-A' of FIG. 1A. As shown in FIGS. 1A and 1B, the static random access memory (SRAM) cell comprises a substrate 100, an access transistor 110 and a storage transistor 118. The substrate 100 is a P-type silicon substrate with an N-well region 108, for example. Furthermore, the substrate 100 has a device isolation structure 102 to define an active region 104. The active region 104 has an opening 106.

The access transistor 110 is set up over the active region 104 of the substrate 100, for example. The access transistor 110 comprises a gate 126, a gate dielectric layer 124, a source region 112a and a drain region 112b. The source region 112a of the transistor 110 is next to the opening 106. The transistor 110 is a P-channel metal-oxide-semiconductor (PMOS) transistor, for example.

The storage transistor 118 is set up over the opening 106 such that the transistor 118 completely fills the opening 106. The gate 114 of the storage transistor 118 serves as an upper electrode of a storage capacitor. Furthermore, a portion of the gate 114 extends into the active region 104 and the device isolation structure 102. The storage transistor 118 is set up between the gate 114 and the substrate 100. A gate dielectric layer 116 serving as a capacitor dielectric layer for the storage capacitor is a silicon oxide layer, a silicon oxynitride layer or an oxide/nitride/oxide composite stack. A channel region 115 of the storage capacitor 118 serves as the lower electrode of the capacitor. Furthermore, the storage transistor 118 and the access transistor 110 both use the source region 112a.

In the aforementioned structure, the opening 106 is set up in the active region 104 and the storage transistor 118 is set up in the opening 106. Hence, the overlapping area between the gate 114 (the upper electrode) and the channel region 115 (the lower electrode) is increased. In general, the capacitance of the capacitor is 2 to 4 times higher than a capacitor having a conventional planar design. Ultimately, the dimension of each SRAM cell can be reduced.

FIGS. 2A to 2D are schematic cross-sectional views showing the steps for fabricating the SRAM cell according to the first embodiment of this invention. In fact, FIGS. 2A to 2D are cross-sectional views along a line A-A' shown in FIG. 1A. In FIGS. 2A to 2D, components identical to the ones in FIGS. 1A and 1B are labeled with identical numbers.

Figure 2A:
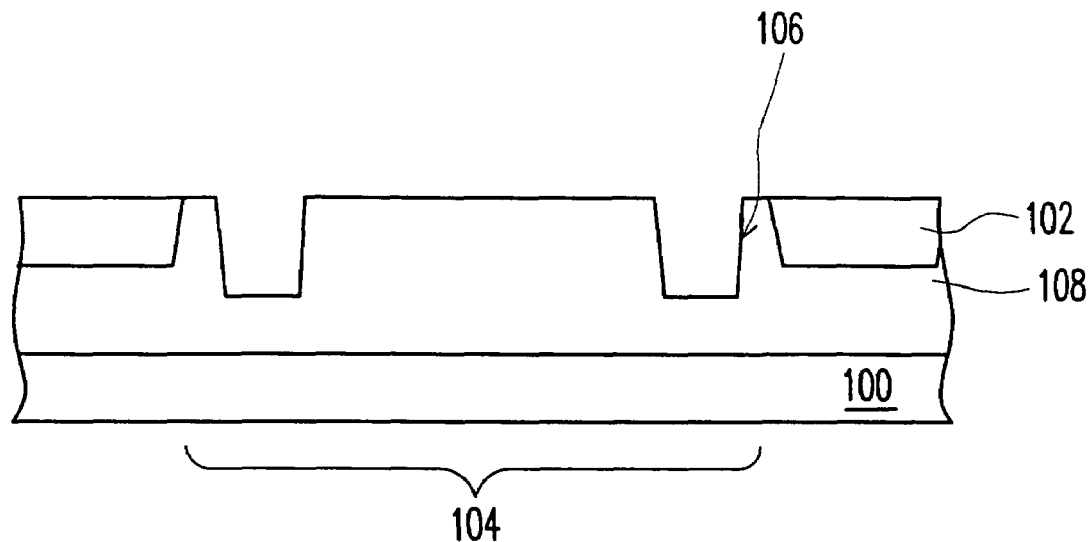
FIGS. 2A to 2D are schematic cross-sectional views showing the steps for fabricating the SRAM cell according to the first embodiment of this invention.

As shown in FIG. 2A, a substrate 100 such as a P-type silicon substrate is provided. An N-well 108 is formed in the substrate 100. Thereafter, a device isolation structure 102 is formed in the substrate to define the active region 104. The device isolation structure 102 is a shallow trench isolation (STI) structure or a local oxidation of silicon (LOCOS) layer, for example. An opening 106 is formed in the substrate 100. The opening 106 is located within the active region 104 such that the opening 106 and the device isolation structure 102 are separated from each other by a distance. The opening 106 is formed, for example, by performing photolithographic and etching processes.

Figure 2B:
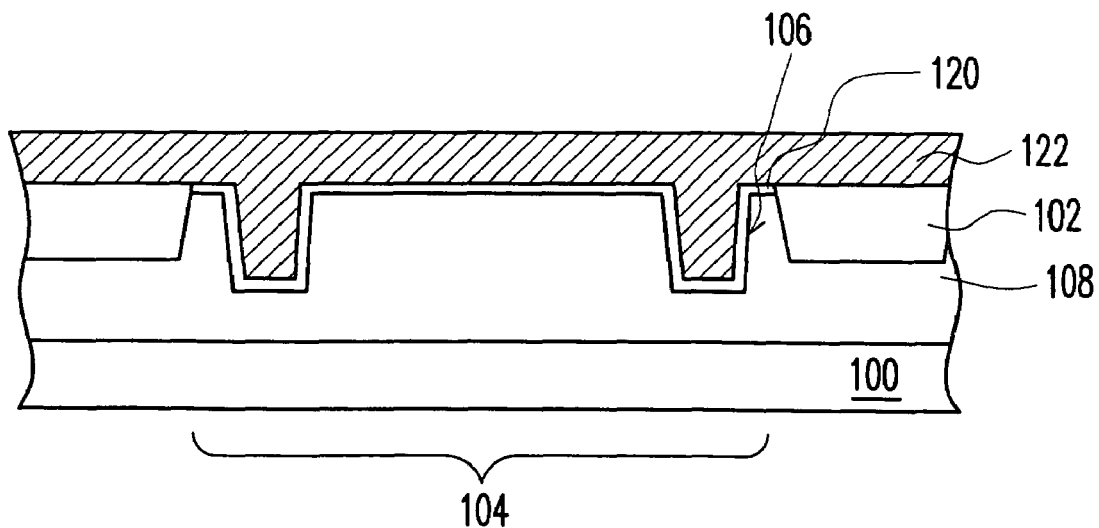

As shown in FIG. 2B, a dielectric layer 120 is formed over the substrate 100. The dielectric layer 120 is a silicon oxide layer formed, for example, by thermal oxidation. Obviously, the dielectric layer 120 can also be a composite oxide/nitride/oxide layer. Thereafter, a conductive layer 122 is formed over the dielectric layer 120. The conductive layer 122 is a doped polysilicon layer formed, for example, by performing a chemical vapor deposition.

Figure 2C:
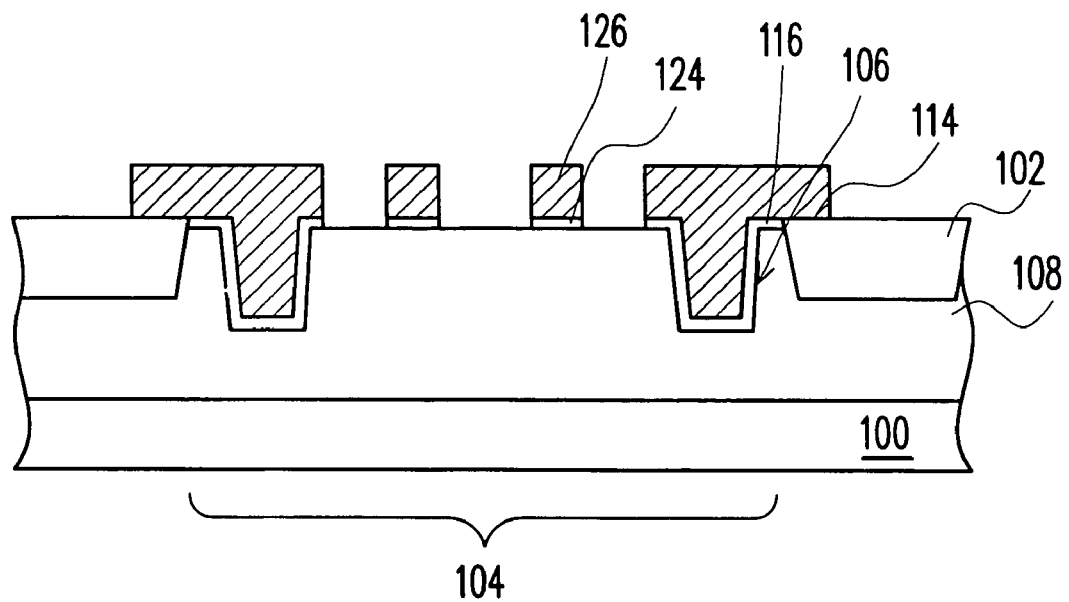

As shown in FIG. 2C, the conductive layer 122 and the dielectric layer 120 are patterned to form a first gate 126, a gate dielectric layer 124, a second gate 114 (the upper electrode) and a gate dielectric layer 116 (the capacitor dielectric layer). The second gate 114 (the upper electrode) completely fills the opening 106 with a portion of the gate 114 covering over the device isolation structure 102. The conductive layer 122 and the dielectric layer 120 are patterned, for example, by performing photolithographic and etching processes.

Figure 2D:
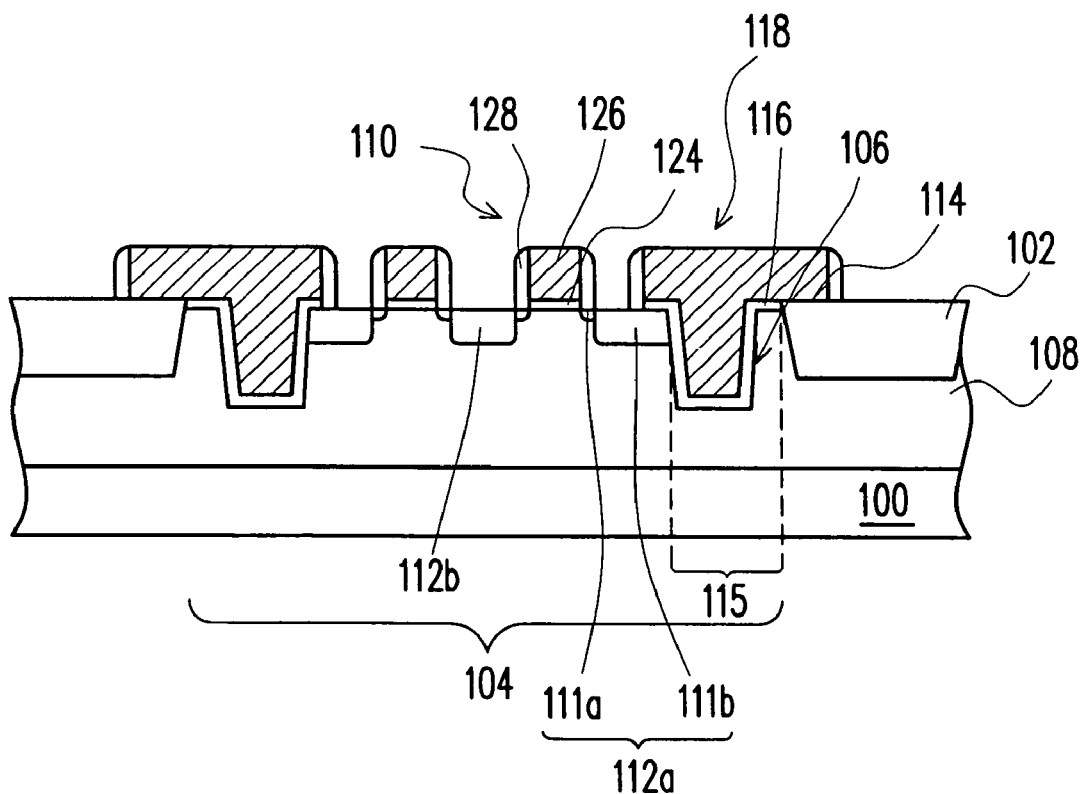

As shown in FIG. 2D, dopants are implanted into the substrate 100 to form a lightly doped region 111a using the first gate 126 and the second gate 114 (the upper electrode) as a mask. The dopants are P-type ions implanted by performing an ion implantation, for example. Thereafter, spacers 128 are formed on the sidewalls of the first gate 126 and the second gate 114 (the upper electrode). The spacers 128 is formed, for example, by depositing insulating material over the substrate 100 to form an insulation layer (not shown) and etching back the insulation layer anisotropically. Dopants are implanted into the substrate 100 using the first gate 126 and the second gate 114 (the upper electrode) as a mask to form a heavily doped region 111b. The dopants are P-type ions implanted by performing an ion implantation, for example. The lightly doped region 111a and the heavily doped region 111b together constitute the source region 112a and the drain region 112b. The gate 126, the gate dielectric layer 124, the source region 112a and the drain region 112b together constitute the access transistor 110. The gate 114 (the upper electrode), the gate dielectric layer 116 (the capacitor dielectric layer, the source region 112a together constitute the storage capacitor 118. The channel region 115 of the storage transistor 118 serves as a lower electrode. Hence, the gate 114 (the upper electrode), the gate dielectric layer 116 (the capacitor dielectric layer, the channel region 115 (the lower electrode) together form a capacitor. Thereafter, other processes needed to complete the fabrication of a 1T-SRAM cell are carried out. Since conventional processes are used, detailed description these processes are omitted.

According to the embodiment of this invention, the opening 106 is formed within the active region 104 and the storage transistor is set up within the opening 106. Hence, the overlapping area between the gate 114 (the upper electrode) and the channel region 115 (the lower electrode) is increased. In other words, the capacitance of the capacitor within each SRAM cell is increased. In general, the capacitance of the capacitor is between 2 to 4 times more than a conventional capacitor having a planar design so that overall dimension of each device can be reduced. Furthermore, the access transistor 110 and the storage capacitor 118 serving as a capacitor are fabricated in the same step so that the amount of processing is reduced and hence the overall cost of producing the SRAM cells is lowered.

Figure 3A:
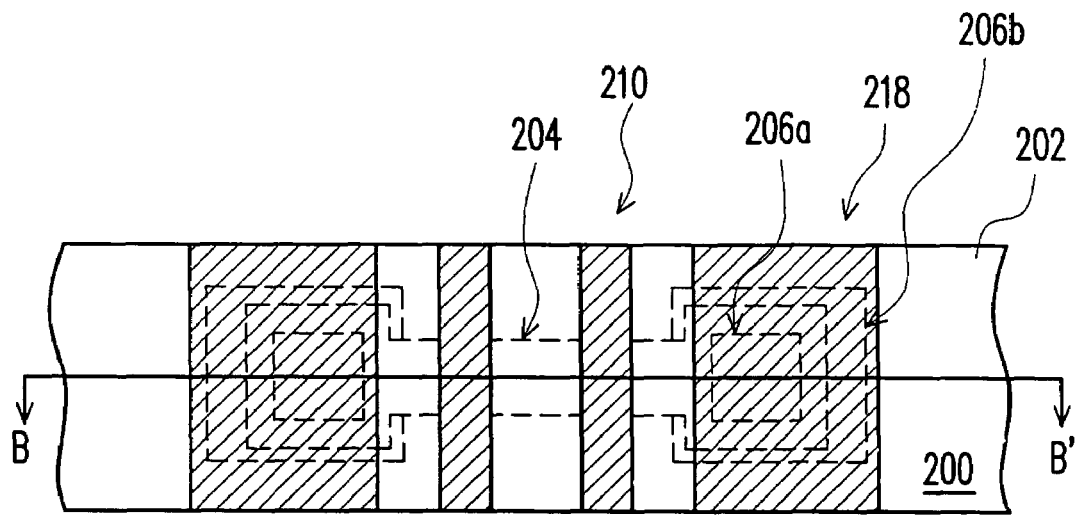
FIGS. 3A and 3B are the respective top view and cross-sectional view of a static random access memory cell structure according to a second preferred embodiment of this invention.
Figure 3B:
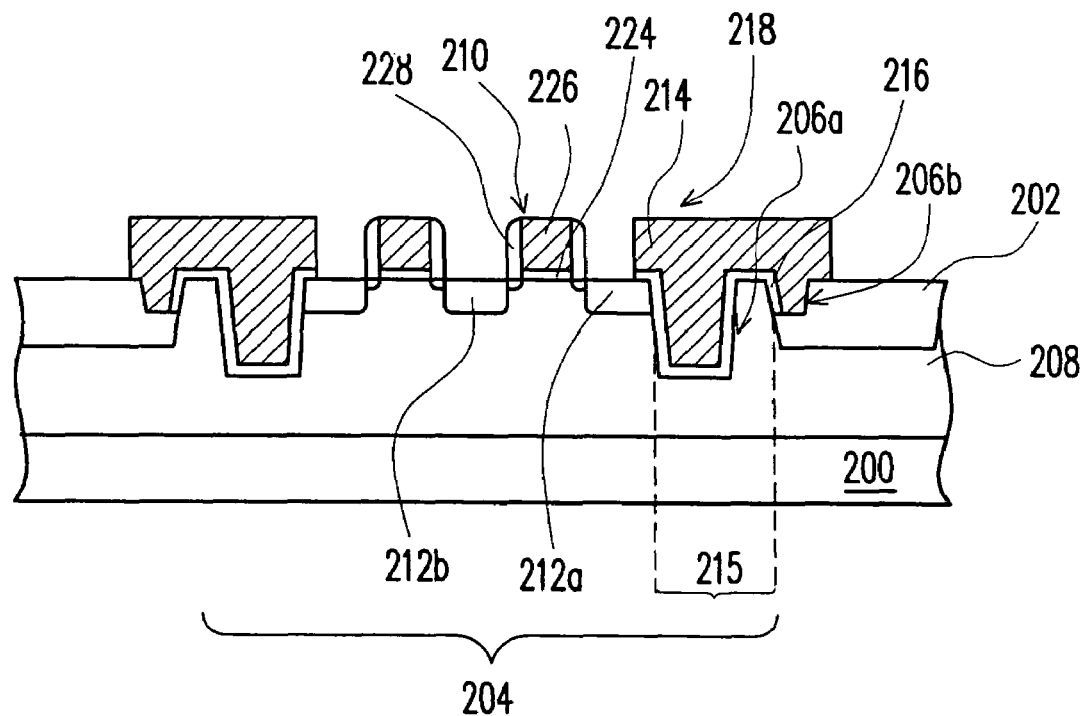

FIGS. 3A and 3B are the respective top view and cross-sectional view of a static random access memory cell structure according to a second preferred embodiment of this invention. FIG. 3B is a cross-sectional view along line B-B' of FIG. 3A. As shown in FIGS. 3A and 3B, the static random access memory (SRAM) cell comprises a substrate 200, an access transistor 210 and a storage transistor 218. The substrate 200 is a P-type silicon substrate with an N-well region 208, for example. Furthermore, the substrate 200 has a device isolation structure 202 to define an active region 204. The active region 204 has an opening 206a. The device isolation structure 202 also has an opening 206b that exposes a portion of the substrate 200 on the sidewalls of the device isolation structure 202.

The access transistor 210 is set up over the active region 204 of the substrate 200, for example. The source region 212a of the access transistor 210 is next to the opening 206a. The transistor 210 is a P-channel metal-oxide-semiconductor (PMOS) transistor, for example.

The storage transistor 218 is set up over the openings 206a and 206b such that the transistor 218 completely fills the openings 206a and 206b. The gate 214 of the storage transistor 218 serves as an upper electrode of a storage capacitor. Furthermore, a portion of the gate 214 covers a portion of the active region 204 and the device isolation structure 202. A gate dielectric layer 216 of the storage transistor 218 is set up between the gate 214 and the substrate 200, for example. The gate dielectric layer 216 serving as a capacitor dielectric layer for the storage capacitor is a silicon oxide layer, a silicon oxynitride layer or an oxide/nitride/oxide composite stack. A channel region 215 of the storage capacitor 218 serves as the lower electrode of the capacitor. Furthermore, the storage transistor 218 and the access transistor 210 both use the source region 212a.

In the aforementioned structure, the openings 206a and 206b are set up within the active region 204 and the device isolation structure respectively. Furthermore, the storage transistor 218 set up over the openings 206a and 206b also completely fills the openings 206a and 206b. Hence, the overlapping area between the gate 214 (the upper electrode) and the channel region 215 (the lower electrode) is increased. In fact, the capacitor in the second embodiment of this invention is able to provide even a greater capacitance than the one in the first embodiment.

Figure 4A:
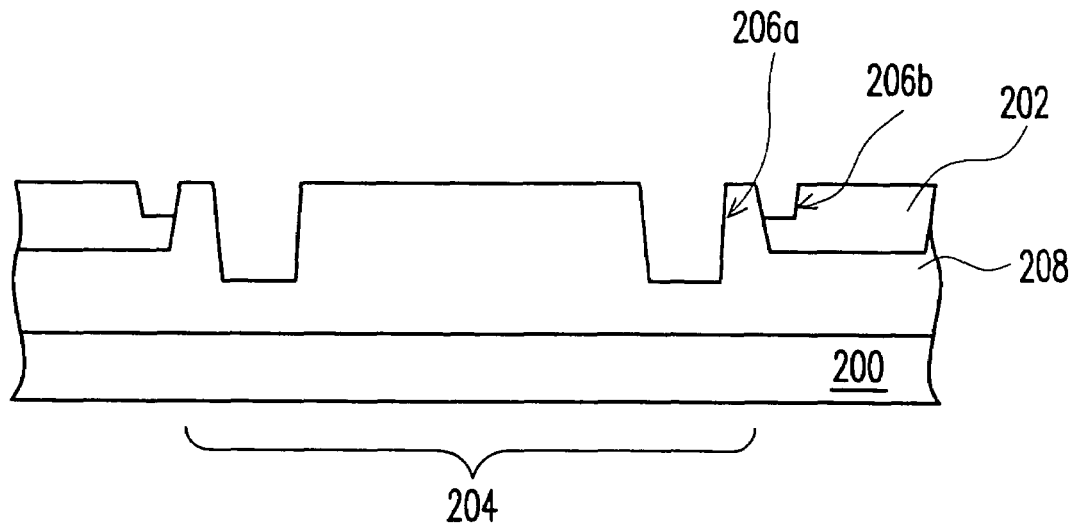
FIGS. 4A to 4D are schematic cross-sectional views showing the steps for fabricating the SRAM cell according to the second embodiment of this invention.
Figure 4B:
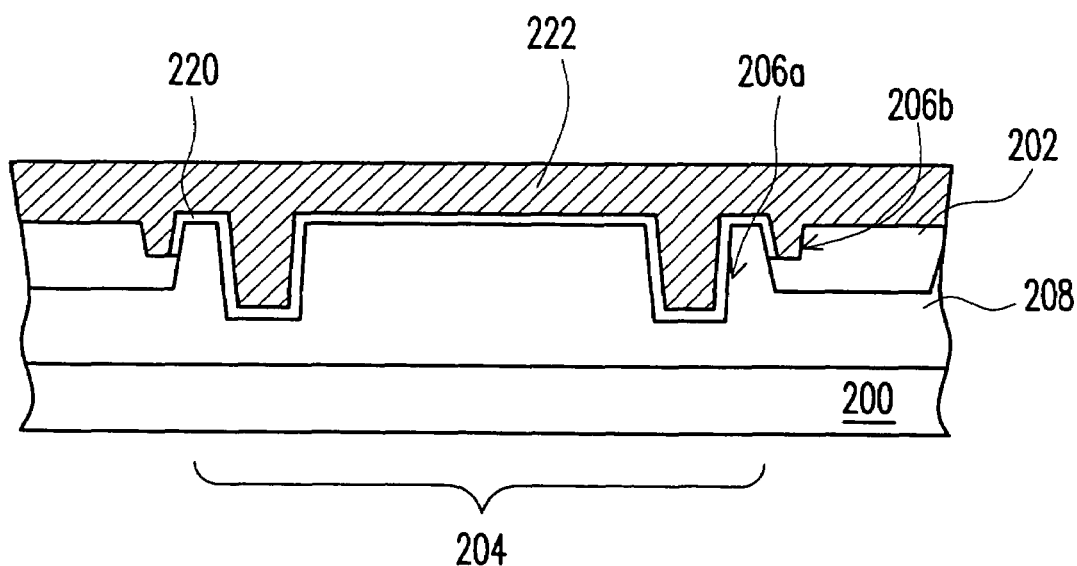
Figure 4C:
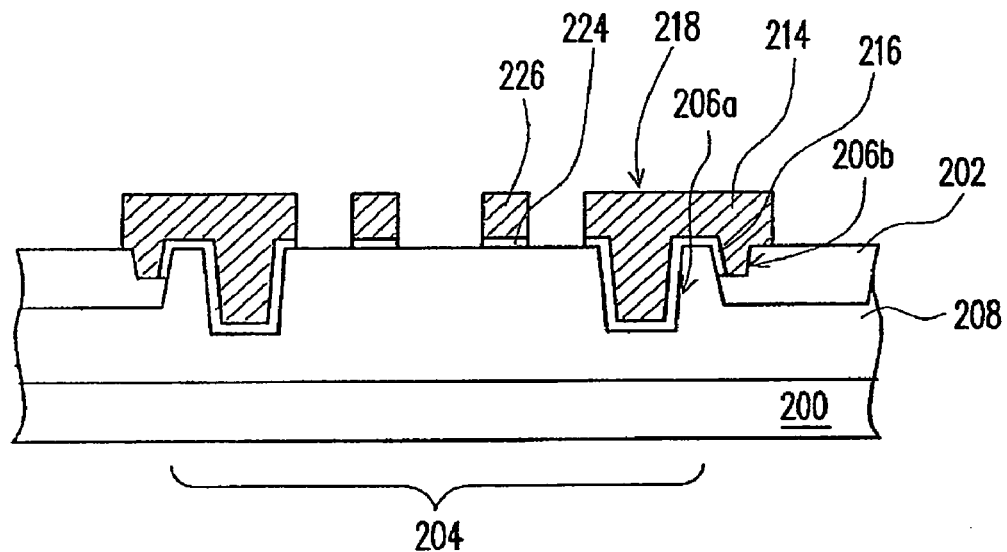
Figure 4D:
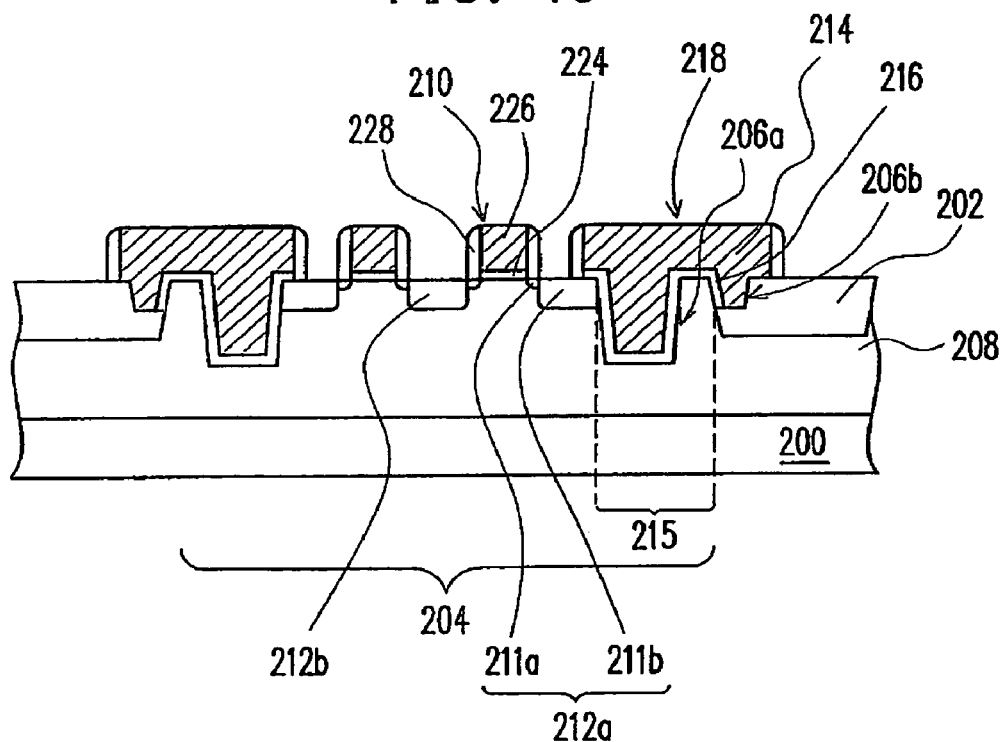

FIGS. 4A to 4D are schematic cross-sectional views showing the steps for fabricating the SRAM cell according to the second embodiment of this invention. In fact, FIGS. 4A to 4D are cross-sectional views along a line B-B' shown in FIG. 3A. In FIGS. 4A to 4D, components identical to the ones in FIGS. 3A and 3B are labeled with identical numbers. Furthermore, the steps carried out in FIGS. 4B to 4D are similar to the ones in FIGS. 2B to 2D. Therefore, to simplify description, only the steps that differ from FIGS. 2B to 2D are explained in detail.

As shown in FIG. 4A, a substrate 200 such as a P-type silicon substrate is provided. An N-well region 208 is formed in the substrate 200. Thereafter, a device isolation structure 202 is formed in the substrate 200 to define an active region 204. The device isolation structure 202 is either a shallow-trench isolation (STI) structure of a local oxidation of silicon (LOCOS) layer, for example. Thereafter, openings 206a and 206b are formed in the substrate 200. The opening 206a is located in the active region 204 separated from the device isolation structure 202 by a distance. On the other hand, the opening 206b is located in the device isolation structure 202. The opening 206b exposes a portion of the substrate 200 on the sidewall of the device isolation structure 202. The openings 206a and 206b are formed, for example, by performing photolithographic and etching processes.

As shown in FIG. 4B, a dielectric layer 220 and a conductive layer 222 are sequentially formed over the substrate 200. The conductive layer 222 at least fills the openings 206a and 206b completely.

As shown in FIG. 4C, the conductive layer 222 and the dielectric layer 220 are patterned to form a gate 224, a gate dielectric layer 226, another gate 214 (the upper electrode) and a gate dielectric layer 216 (the capacitor dielectric layer). The gate 214 (the upper electrode) completely fills the openings 206a and 206b. Furthermore, the gate 214 (the upper electrode) covers a portion of the active region 204 and a portion of the device isolation structure 202. The conductive layer 222 and the dielectric layer 220 are patterned, for example, by performing photolithographic and etching processes.

As shown in FIG. 4D, a source region 212a and a drain region 212b are formed in the substrate 200. Thereafter, spacers 228 are formed on the sidewalls of the gate 226 and the gate 214 (the upper electrode). The source region 212a and the drain region 212b comprise a lightly doped region 211a and a heavily doped region 211b. The gate 226, the gate dielectric layer 224, the source region 212a and the drain region 212b together constitute the access transistor 210. The gate 214 (the upper electrode), the gate dielectric layer 216 (the capacitor dielectric layer) and the source region 212a together constitute the storage transistor 218. The channel region 215 of the storage transistor 218 serves as a lower electrode. Hence, the gate 214 (the upper electrode), the gate dielectric layer 216 (the capacitor dielectric layer) and the channel region 215 (the lower electrode) together constitute the capacitor. Thereafter, other processes needed to complete the fabrication of a 1T-SRAM cell are carried out. Since conventional processes are used, detailed description these processes are omitted.

According to the embodiment of this invention, the openings 206a and 26b are formed in the active region 204 and the device isolation structure respectively. Furthermore, the storage transistor 218 is formed over the openings 206a and 206b such that the storage transistor 218 completely fills the openings 206a and 206b. Hence, the overlapping area between the gate 214 (the upper electrode) and the channel region 215 (the lower electrode) is increased. In fact, the capacitor in the second embodiment of this invention is able to provide even a greater capacitance than the one in the first embodiment.

Furthermore, the access transistor 210 and the storage transistor 218 serving as a capacitor in the SRAM cell are formed in the same step. Therefore, the amount of processing and the cost of producing the SRAM cell are reduced. Moreover, both openings 206a and 206b are formed in the same process. Hence, no addition processing steps are required.

Figure 5A:
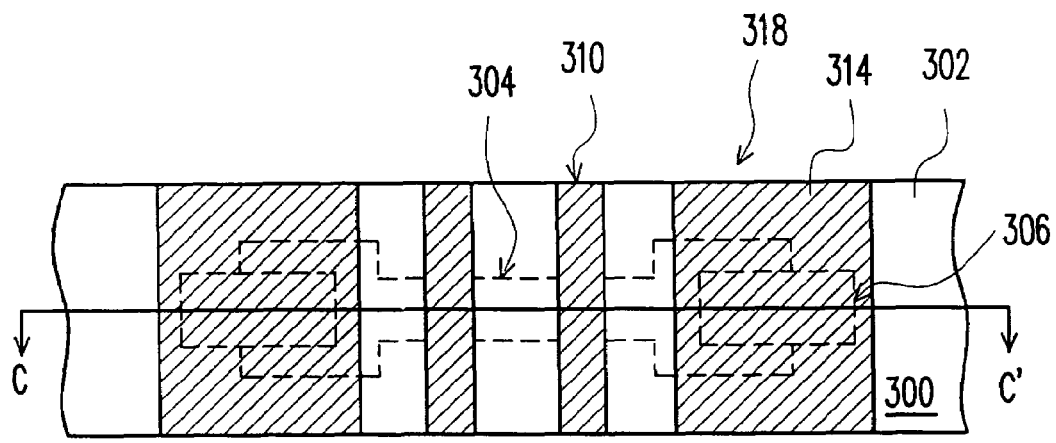
FIGS. 5A and 5B are the respective top view and cross-sectional view of a static random access memory cell structure according to a third preferred embodiment of this invention.
Figure 5B:
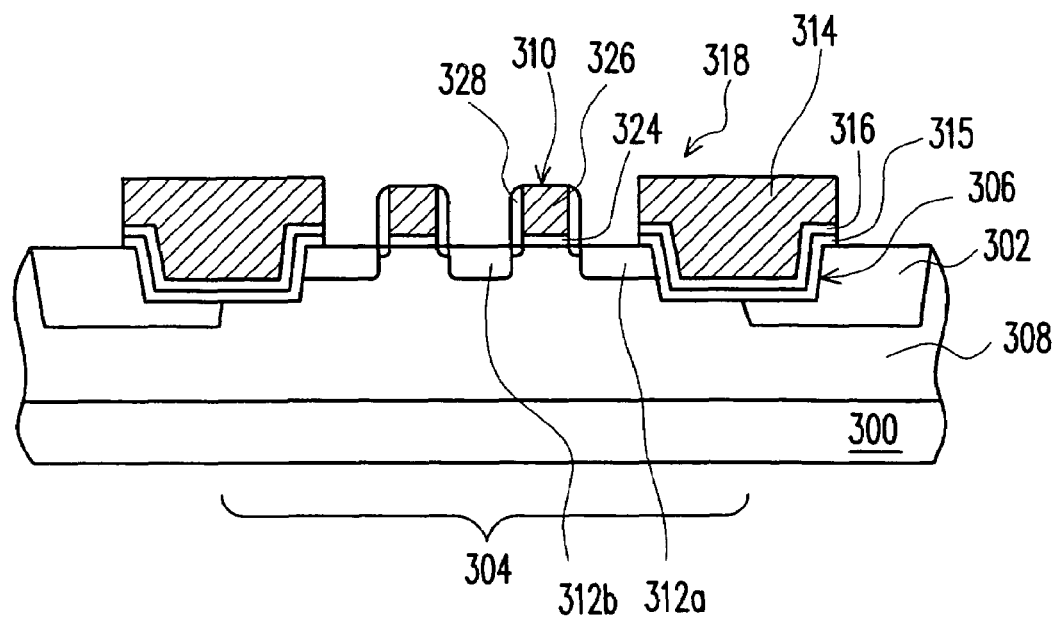

FIGS. 5A and 5B are the respective top view and cross-sectional view of a static random access memory cell structure according to a third preferred embodiment of this invention. FIG. 5B is a cross-sectional view along line C-C' of FIG. 5A. As shown in FIGS. 5A and 5B, the static random access memory (SRAM) cell comprises a substrate 300, an access transistor 310 and a storage transistor 318. The substrate 300 is a P-type silicon substrate with an N-well region 308, for example. Furthermore, the substrate 300 has a device isolation structure 302 to define an active region 304. The substrate 300 has an opening 306. A portion of the opening 306 lies within the active region 304 and a portion of the opening 306 lies within the device isolation structure 302.

The access transistor 310 is set up over the active region 304 of the substrate 300, for example. The source region 312a of the access transistor 310 is next to the opening 306. The access transistor 310 is a P-channel metal-oxide-semiconductor (PMOS) transistor, for example.

A lower electrode 315 is set up on the surface of the opening 306. The storage transistor 318 is set up over the opening 306 such that the storage transistor 318 completely fills the opening 306. The gate 314 of the storage transistor 318 serves as the upper electrode of a storage capacitor. Furthermore, a portion of the gate 314 extends into the active region 304 and the device isolation structure 302. The gate dielectric layer 316 of the storage transistor 318 is set up between the gate 314 (the upper electrode) and the lower electrode 315. The gate dielectric layer 316 serving as a capacitor dielectric layer of the storage capacitor is a silicon oxide layer, a silicon oxynitride layer or a composite oxide/nitride/oxide stack, for example. The lower electrode 315 is the channel region 315 of the storage transistor 318. The storage transistor 318 and the access transistor 310 both use the same source region 312a.

In the aforementioned structure, a portion of the opening 306 is set up in the active region 304 and a portion of the opening 306 is set up in the device isolation structure 302. Furthermore, the storage transistor 318 is set up within the opening 306. Hence, the overlapping area between the gate 314 (the upper electrode) and the channel region 315 (the lower electrode) is increased. In general, the capacitor can have a capacitance 3 to 4 times higher than a capacitor with a conventional planar design. Ultimately, the dimension of each SRAM cell can be reduced.

Figure 6A:
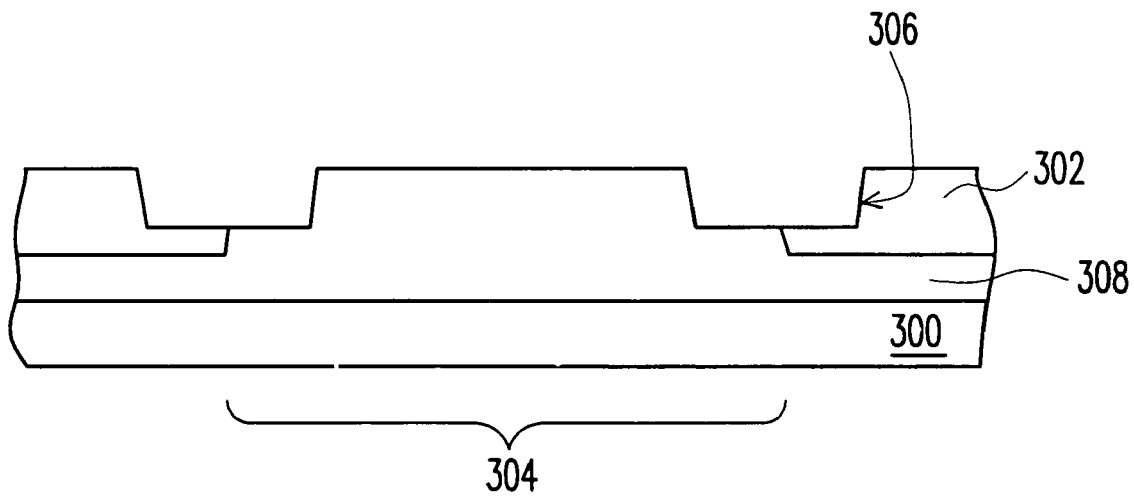
FIGS. 6A to 6D are schematic cross-sectional views showing the steps for fabricating the SRAM cell according to the third embodiment of this invention.
Figure 6B:
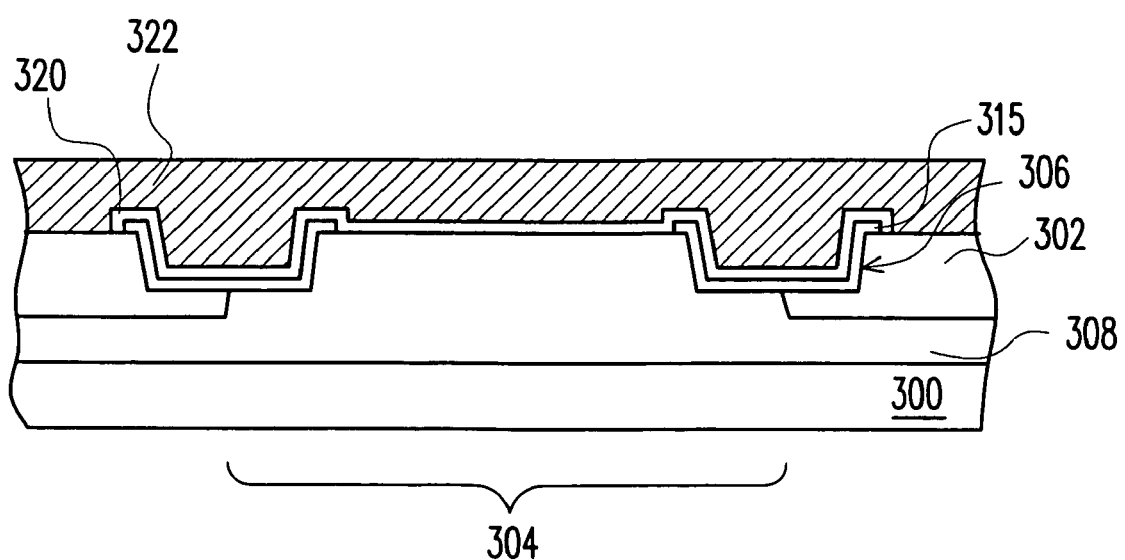
Figure 6C:
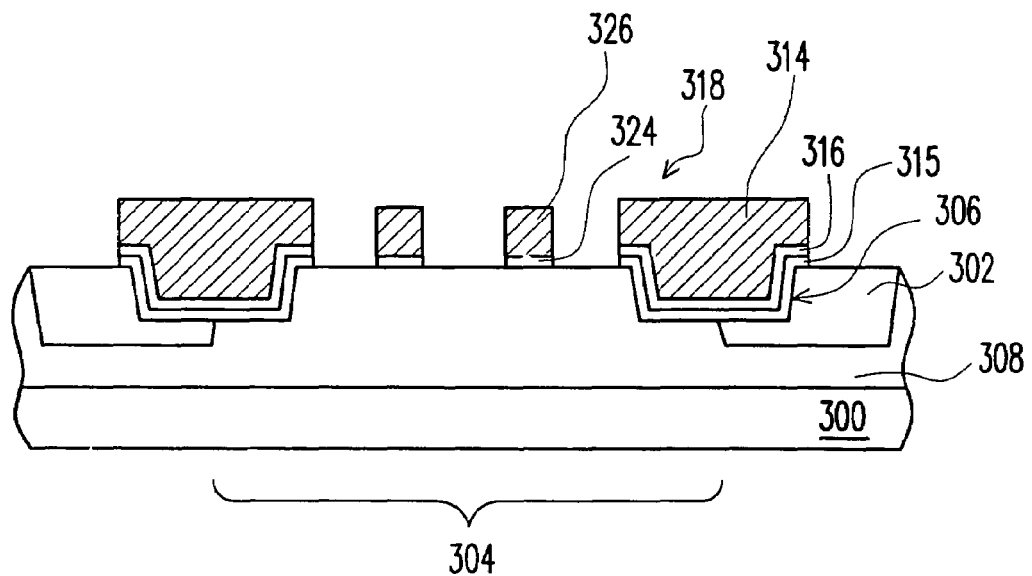
Figure 6D:
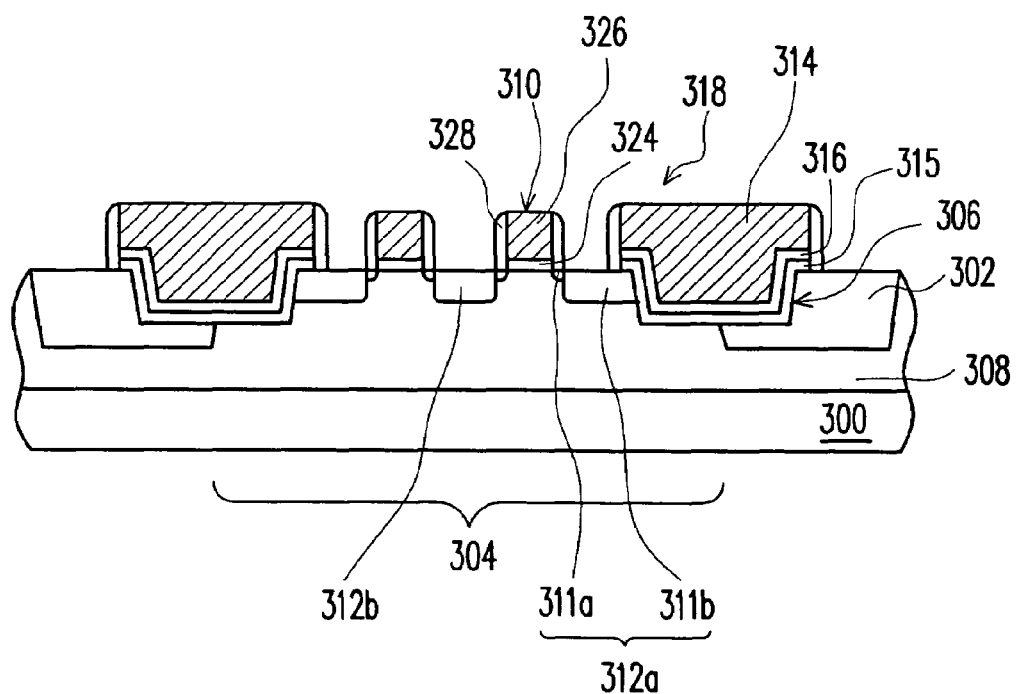

FIGS. 6A to 6D are schematic cross-sectional views showing the steps for fabricating the SRAM cell according to the third embodiment of this invention. In fact, FIGS. 6A to 6D are cross-sectional views along a line C-C' shown in FIG. 5A. In FIGS. 6A to 6D, components identical to the ones in FIGS. 5A and 5B are labeled with identical numbers. Furthermore, the steps carried out in FIGS. 6B to 6D are similar to the ones in FIGS. 2B to 2D. Therefore, to simplify description, only the steps that differ from FIGS. 2B to 2D are explained in detail.

As shown in FIG. 6A, a substrate 300 such as a P-type silicon substrate is provided. An N-well region 308 is formed in the substrate 300. Thereafter, a device isolation structure 302 is formed in the substrate 300 to define an active region 304. The device isolation structure 302 is either a shallow-trench isolation (STI) structure of a local oxidation of silicon (LOCOS) layer, for example. Thereafter, an opening 306 is formed in the substrate 300. A portion of the opening 306 lies in the active region 304 and a portion of the opening 306 lies in the device isolation structure 302. The opening 306 is formed, for example, by performing photolithographic and etching processes.

As shown in FIG. 6B, a lower electrode 315 is formed in the opening 306. The lower electrode 315 is a silicon layer or a polysilicon layer formed, for example, by depositing silicon (or polysilicon) over the substrate 300 and patterning the silicon layer (or the polysilicon layer). Thereafter, a dielectric layer 320 is formed over the substrate 300. The dielectric layer 320 is a silicon oxide layer formed, for example, by thermal oxidation. Obviously, the dielectric layer 320 can be a composite oxide/nitride/oxide stack. A conductive layer 322 is formed over the dielectric layer 320. The conductive layer 322 is a doped polysilicon formed by chemical vapor deposition, for example.

As shown in FIG. 6C, the conductive layer 322 and the dielectric layer 320 are patterned to form a gate 326, a gate dielectric layer 324, another gate 314 (an upper electrode) and a gate dielectric layer 316 (a capacitor dielectric layer). The gate 314 (the upper electrode) fills the opening 306 completely. The conductive layer 322 and the dielectric layer 320 are pattered by performing photolithographic and etching processes, for example.

As shown in FIG. 6D, a source region 312a and a drain region 312b are formed in the substrate 300. Spacers 328 are formed on the sidewalls of the gate 326. The source region 312a and the drain region 312b comprise a lightly doped region 311a and a heavily doped region 311b. The gate 326, the gate dielectric layer 324, the source region 312a and the drain region 312b together constitute an access transistor 310. The gate 314 (the upper electrode), the gate dielectric layer 316 (the capacitor dielectric layer) and the source region 312a together constitute a storage transistor 318. The lower electrode 315 serves as a channel region 315 for the storage transistor 318. The gate 314 (the upper electrode), the gate dielectric layer 316 (the capacitor dielectric layer) and the channel region 315 (the lower electrode) together form a capacitor. Thereafter, other processes needed to complete the fabrication of a 1T-SRAM cell are carried out. Since conventional processes are used, detailed description these processes are omitted.

In the aforementioned structure, a portion of the opening 306 lies in the active region 304 and a portion of the opening 306 lies in the device isolation structure 302. Furthermore, the storage transistor 318 is set up within the opening 306. Hence, the overlapping area between the gate 314 (the upper electrode) and the channel region 315 (the lower electrode) is increased. In general, the capacitor can have a capacitance 3 to 4 times higher than a capacitor having a conventional planar design. Moreover, a portion of the storage transistor 318 is formed in the device isolation structure 302 so that the dimension of each SRAM cell can be further reduced. In addition, the access transistor 310 and the storage capacitor 318 serving as a capacitor are formed in the same process. Hence, the production process is simplified and the cost of producing the device is reduced.

Figure 7A:
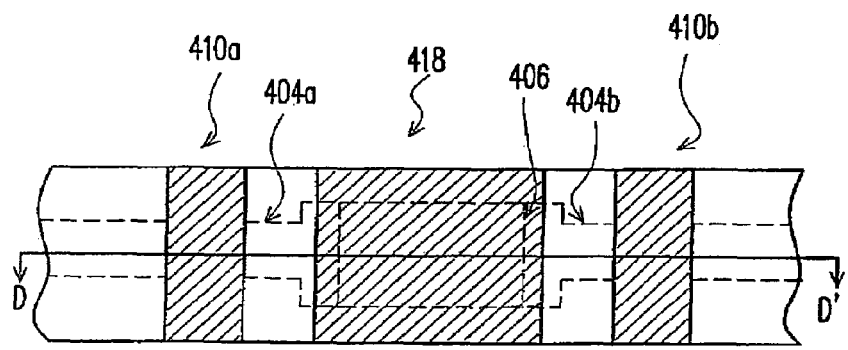
FIGS. 7A and 7B are the respective top view and cross-sectional view of a static random access memory cell structure according to a fourth preferred embodiment of this invention.
Figure 7B:
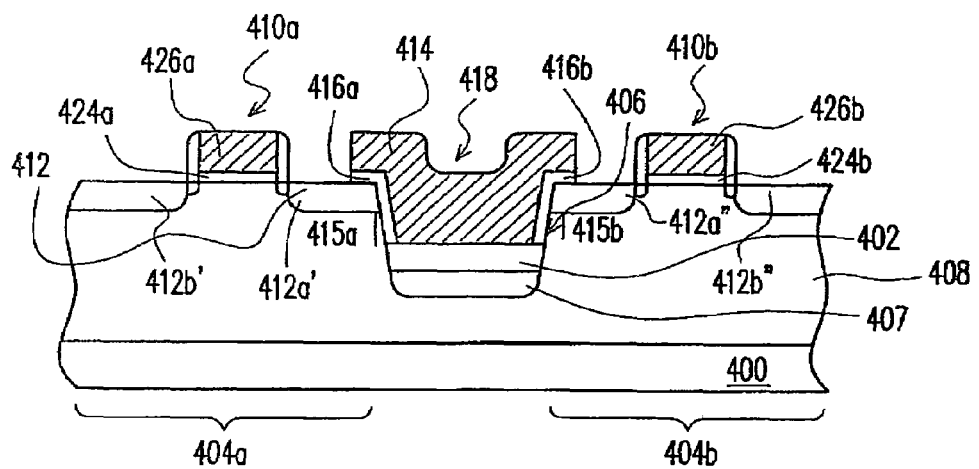

FIGS. 7A and 7B are the respective top view and cross-sectional view of a static random access memory cell structure according to a fourth preferred embodiment of this invention. FIG. 7B is a cross-sectional view along line D-D' of FIG. 7A. As shown in FIGS. 7A and 7B, the static random access memory (SRAM) cell comprises a substrate 400, a first access transistor 410a, a second access transistor 410b and a storage transistor 418. The substrate 400 is a P-type silicon substrate with an N-well region 408, for example. Furthermore, the substrate 400 has a device isolation structure 402 to define a first active region 404a and a second active region 404b. The device isolation structure 402 has an opening 406. The opening 406 exposes a portion of the substrate 400 on the sidewall of the device isolation structure 402.

The access transistors 410a and 410b are set up over the active region 404a and the active region 404b of the substrate 400, for example. Furthermore, the source region 412a' of the access transistor 410a and the source region 412a" of the access transistor 410b are next to the opening 406. The access transistors 410a and 410b are P-channel metal-oxide-semiconductor (PMOS) transistors, for example.

The storage transistor 418 is set up over the openings 406 such that the transistor 418 completely fills the opening 406. The gate 414 of the storage transistor 418 serves as an upper electrode of a storage capacitor. Furthermore, a portion of the gate 414 extends into active region 404. The gate dielectric layer 416a and the gate dielectric layer 416b of the storage transistor 418 are set up between the gate 414 (the upper electrode) and the substrate 400. The gate dielectric layer 416a and the gate dielectric layer 416b serving as capacitor dielectric layer for a storage capacitor are silicon oxide layers, silicon oxynitride layers or composite oxide/nitride/oxide layers. The channel region 415a and the channel region 415b of the storage transistor 418 serves as lower electrode of the capacitor. The storage transistor 418 and the access transistor 410a both use the same source region 412a'. Similarly, the storage transistor 418 and the access transistor 410b both use the same source region 412a". An additional doped isolation region 407 is also formed in the substrate 400 at the bottom of the device isolation structure 402 to isolate the channel regions 415a and 415b.

In the aforementioned structure, the opening 406 is set up in the device isolation structure 402 and the storage transistor 408 is set up within the opening 406. Hence, the overlapping area between the gate 414 (the upper electrode) and the channel regions 415a and 415b (the lower electrode) is increased. In general, the capacitor can have a capacitance 3 to 4 times higher than a capacitor with a conventional planar design. Furthermore, the storage transistor 418 is set up within the device isolation structure 402 and hence a further reduction of device dimension is permitted.

Figure 8A:
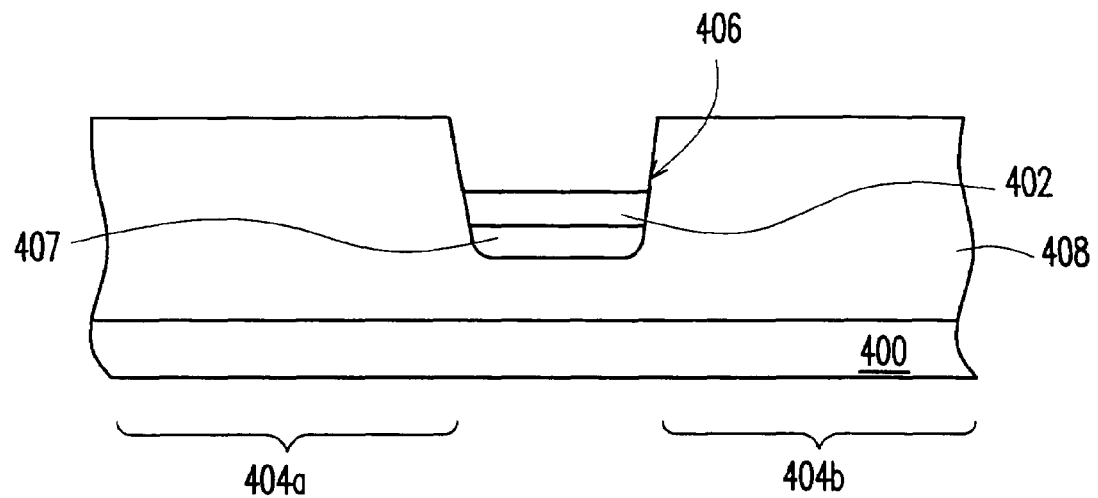
FIGS. 8A to 8D are schematic cross-sectional views showing the steps for fabricating the SRAM cell according to the fourth embodiment of this invention.
Figure 8B:
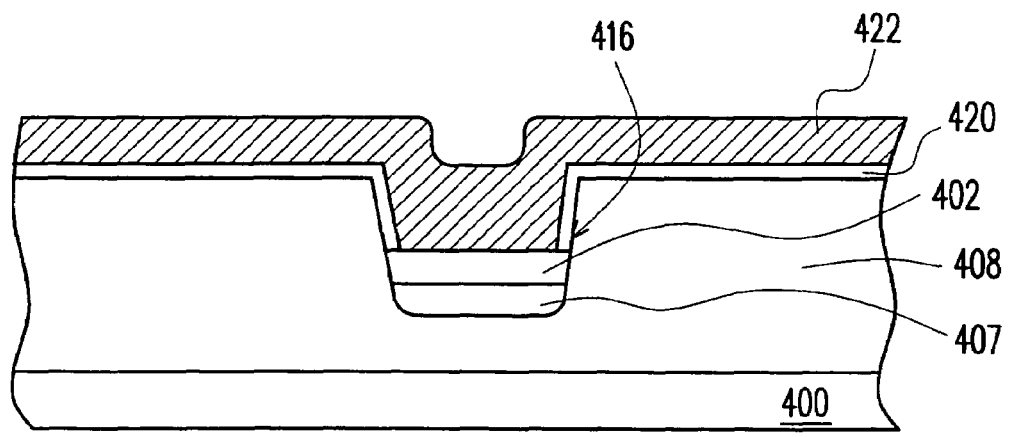
Figure 8C:
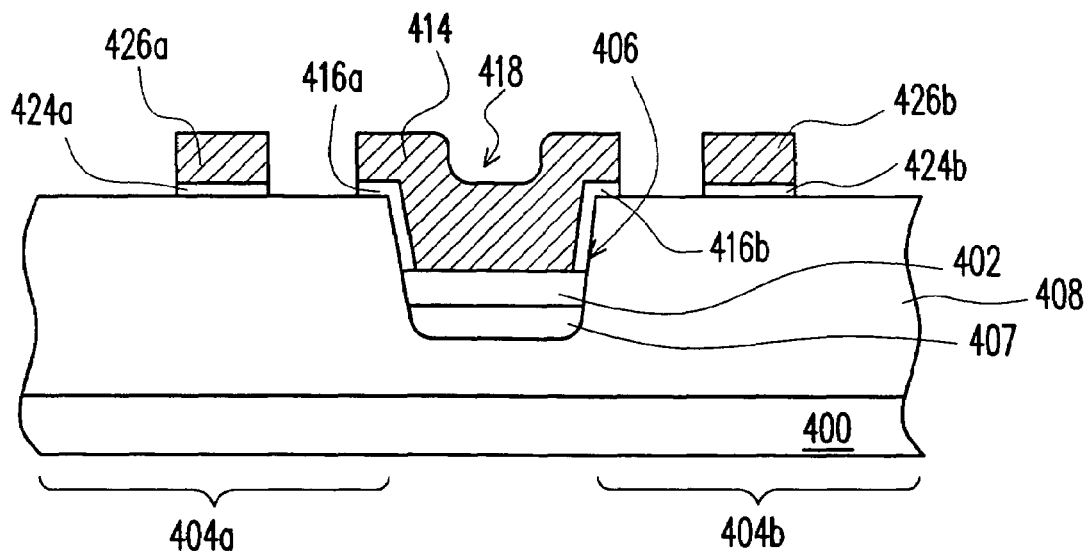
Figure 8D:
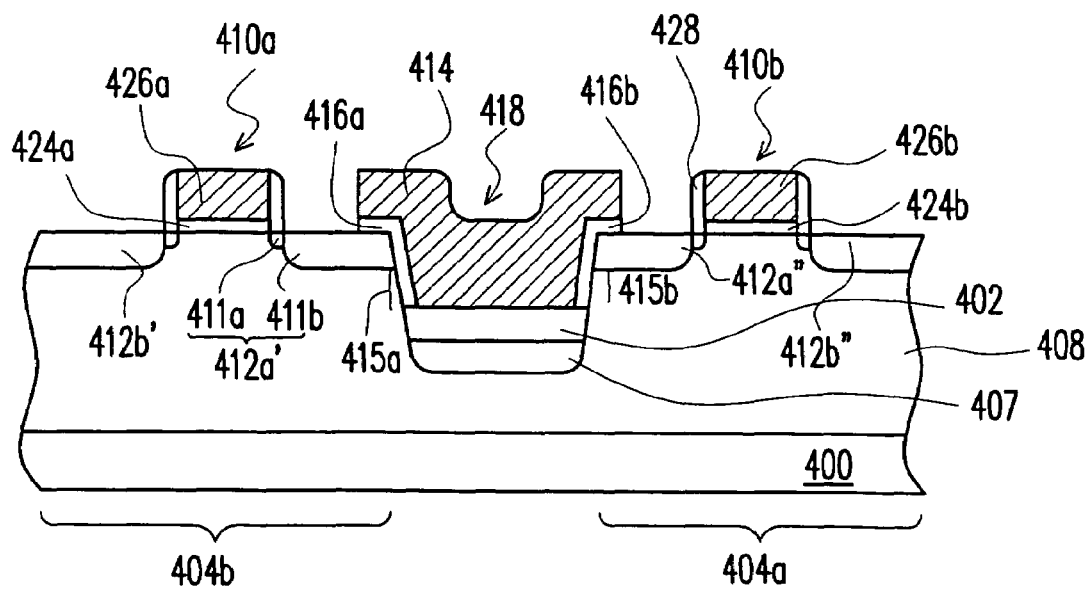

FIGS. 8A to 8D are schematic cross-sectional views showing the steps for fabricating the SRAM cell according to the fourth embodiment of this invention. In fact, FIGS. 8A to 8D are cross-sectional views along a line D-D' shown in FIG. 7A. In FIGS. 8A to 8D, components identical to the ones in FIGS. 7A and 7B are labeled with identical numbers. Furthermore, the steps carried out in FIGS. 8B to 8D are similar to the ones in FIGS. 2B to 2D. Therefore, to simplify description, only the steps that differ from FIGS. 2B to 2D are explained in detail.

As shown in FIG. 8A, a substrate 400 such as a P-type silicon substrate is provided. An N-well region 408 is formed in the substrate 400. Thereafter, a device isolation structure 402 is formed in the substrate 400 to define active regions 404a and 404b. The device isolation structure 402 is either a shallow-trench isolation (STI) structure of a local oxidation of silicon (LOCOS) layer, for example. Thereafter, an opening 406 is formed in the device isolation structure 402. The opening 406 exposes a portion of the substrate 400 on the sidewall of the device isolation structure 402. The opening 406 is formed, for example, by performing photolithographic and etching processes. Next, dopants are implanted into the substrate 400 at the bottom of the device isolation structure 402 to form a doped isolation region 407.

As shown in FIG. 8B, a dielectric layer 420 is formed over the substrate 400. The dielectric layer 420 is a silicon oxide layer formed, for example, by thermal oxidation. Obviously, the dielectric layer 420 can be a composite oxide/nitride/oxide stack. Thereafter, a conductive layer 422 is formed over the dielectric layer 420. The conductive layer 422 is a doped polysilicon formed by chemical vapor deposition, for example.

As shown in FIG. 8C, the conductive layer 422 and the dielectric layer 420 are patterned to form a gate 426a, a gate 426b, a gate dielectric layer 424a, a gate dielectric layer 424b, a gate 414 (an upper electrode), a gate dielectric layer 416a (a capacitor dielectric layer) and a gate dielectric layer 416b (a capacitor dielectric layer). The gate 414 (the upper electrode) fills the opening 406 completely. The conductive layer 422 and the dielectric layer 420 are pattered by performing photolithographic and etching processes, for example.

As shown in FIG. 8D, a source region 412a' (a source region 412a") and a drain region 412b' (a drain region 412b") are formed in the substrate 400. Spacers 428 are formed on the sidewalls of the gate 426. The source region 412a' (the source region 412a") and the drain region 412b' (the drain region 412b") comprise a lightly doped region 411a and a heavily doped region 411b. The gate 426a, the gate dielectric layer 424a, the source region 412a' and the drain region 412b' together constitute an access transistor 410a. The gate 426b, the gate dielectric layer 424b, the source region 412a" and the drain region 412b" together constitute an access transistor 410b. The gate 414 (the upper electrode), the gate dielectric layer 416a (the capacitor dielectric layer), the gate dielectric layer 416b (the capacitor dielectric layer), the source region 412a' and the source region 412a" together constitute a storage transistor 418. The channel regions 415a and 415b serve as the lower electrode of the storage capacitor. The gate 414 (the upper electrode), the gate dielectric layer 416a (the capacitor dielectric layer), the channel region 415a (the lower electrode) together constitute a capacitor adjacent to the access transistor 410a. Similarly, the gate 414 (the upper electrode, the gate dielectric layer 416b (the capacitor dielectric layer), the channel region 415b (the lower electrode) together constitute another capacitor adjacent to the access transistor 410b. In other words, the capacitor serving both the access transistor 410a and the access transistor 410b uses the same upper electrode. Thereafter, other processes needed to complete the fabrication of a 1T-SRAM cell are carried out. Since conventional processes are used, detailed description these processes are omitted.

In the aforementioned structure, the opening 406 is formed in the device isolation structure 402 and the storage transistor 418 is formed within the opening 406. Hence, the overlapping area between the gate 414 (the upper electrode) and the channel regions 415a and 415b (the lower electrode) is increased. In general, the capacitor can have a capacitance 2 to 4 times higher than a capacitor with a conventional planar design. Furthermore, the storage transistor 418 is formed within the device isolation structure 402 and the capacitor connected to the access transistors 410a and 410b uses the same upper electrode and hence a further reduction of device dimension is permitted. In addition, the access transistor 410 and the storage capacitor 418 serving as a capacitor are formed in the same process. Hence, the production process is simplified and the cost of producing the device is reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A static random access memory (SRAM) cell structure, comprising:
   a substrate having a device isolation structure therein to define a first active region and a second active region, wherein the device isolation structure between the first active region and the second active region has an opening that exposes a portion of the substrate on the sidewall of the device isolation structure, and the opening is directly above and completely exposing an upper surface of the device isolation structure;
   a first transistor and a second transistor set up over the first active region and the second active region of the substrate respectively, wherein the source regions of the first transistor and the second transistor are next to the opening;
   an upper electrode set up over and completely filled the opening; and
   a capacitor dielectric layer set up between the upper electrode and the substrate, wherein the source regions of the first transistor and the second transistor are contiguous to the capacitor dielectric layer.

2. The SRAM cell structure of claim 1, wherein the structure further comprises a doped isolation region set up at the bottom of the device isolation structure.

3. The SRAM cell structure of claim 1, wherein the capacitor dielectric layer comprises a composite silicon oxide/silicon nitride/silicon oxide stack layer.

* * * * *